United States Patent
Schiller et al.

(10) Patent No.: US 9,384,786 B2
(45) Date of Patent: Jul. 5, 2016

(54) POWER MANAGEMENT IN AN ELECTRONIC SYSTEM THROUGH REDUCING ENERGY USAGE OF A BATTERY AND/OR CONTROLLING AN OUTPUT POWER OF AN AMPLIFIER THEREOF

(71) Applicants: Christopher T. Schiller, Redding, CA (US); Michael Joseph Shaw, Granite Bay, CA (US)

(72) Inventors: Christopher T. Schiller, Redding, CA (US); Michael Joseph Shaw, Granite Bay, CA (US)

( * ) Notice: Subject to any disclaimer, the term of this patent is extended or adjusted under 35 U.S.C. 154(b) by 0 days.

(21) Appl. No.: 15/007,235

(22) Filed: Jan. 27, 2016

(65) Prior Publication Data

US 2016/0141004 A1    May 19, 2016

Related U.S. Application Data

(62) Division of application No. 13/483,151, filed on May 30, 2012, now Pat. No. 9,275,690.

(51) Int. Cl.
*G11C 5/14* (2006.01)

(52) U.S. Cl.
CPC ............... *G11C 5/141* (2013.01); *G11C 5/148* (2013.01)

(58) Field of Classification Search
CPC ............ G11C 5/14; G11C 5/141; H02J 7/00; H02J 3/38; H03F 3/04
See application file for complete search history.

(56) References Cited

U.S. PATENT DOCUMENTS

| | | | |
|---|---|---|---|
| 2002/0146993 A1* | 10/2002 | Persico | H03F 1/0261 455/126 |
| 2007/0173286 A1* | 7/2007 | Carter | H04B 1/0082 455/553.1 |

* cited by examiner

*Primary Examiner* — Hien Nguyen
(74) *Attorney, Agent, or Firm* — Raj Abhyanker, P.C.

(57) ABSTRACT

A method includes automatically charging a capacitor coupled to a battery configured to power a memory through a charge switch that is closed whenever a voltage of the battery exceeds a recovery trip voltage or exceeds a shutdown trip voltage but is less than the recovery trip voltage and opened whenever the voltage of the battery drops below the shutdown trip voltage such that a minimum voltage of the shutdown trip voltage is maintained on the battery, thereby enabling the memory to retain information therein. The method also includes rendering a stored energy of the capacitor available to all circuitry coupled to the battery following the charging thereof through coupling the capacitor in parallel with the battery based on closure of a discharge switch following the charging of the capacitor.

6 Claims, 13 Drawing Sheets

─ 902

CONFIGURE A BATTERY AND/OR A VOLTAGE REGULATOR CONFIGURED TO REGULATE AN OUTPUT VOLTAGE OF THE BATTERY TO SUPPLY POWER TO A MEMORY OF AN ELECTRONIC CIRCUIT ALSO INCLUDING A NON-MEMORY CIRCUITRY BASED ON SWITCHING THE SUPPLY OF POWER BETWEEN THE BATTERY AND THE VOLTAGE REGULATOR SUCH THAT: THE MEMORY IS POWERED FROM THE BATTERY WHEN THE NON-MEMORY CIRCUITRY IS INACTIVE, THE MEMORY IS POWERED FROM A COMBINATION OF VOLTAGE FROM THE BATTERY AND THE VOLTAGE REGULATOR WHEN THE MEMORY IS ABOUT TO COMMUNICATE WITH THE NON-MEMORY CIRCUITRY DURING A TRANSITION OF THE NON-MEMORY CIRCUITRY INTO AN ACTIVE STATE THEREOF, AND THE MEMORY AND THE NON-MEMORY CIRCUITRY ARE POWERED FROM THE VOLTAGE REGULATOR DURING THE ACTIVE STATE OF THE NON-MEMORY CIRCUITRY, THEREBY MINIMIZING CURRENT DRAWN FROM THE BATTERY WHILE PRESERVING A STATE OF THE MEMORY OF THE ELECTRONIC CIRCUIT

POWER MANAGEMENT IN AN ELECTRONIC SYSTEM THROUGH REDUCING ENERGY USAGE OF A BATTERY AND/OR CONTROLLING AN OUTPUT POWER OF AN AMPLIFIER THEREOF

CLAIM OF PRIORITY

This application is a Divisional Application of and claims priority to the U.S. Non-Provisional patent application Ser. No. 13/483,151 titled POWER MANAGEMENT IN AN ELECTRONIC SYSTEM THROUGH REDUCING ENERGY USAGE OF A BATTERY AND/OR CONTROLLING AN OUTPUT POWER OF AN AMPLIFIER THEREOF filed on May 30, 2012.

FIELD OF TECHNOLOGY

This disclosure relates generally to electronic systems and, more particularly, to a method, a circuit and/or a system of power management in an electronic system through reducing energy usage of a battery and/or controlling output power of an amplifier thereof.

BACKGROUND

An integrated power management system may include an amplifier, a volatile memory and a number of circuits powered from a battery associated with a voltage regulator. It may be difficult to shut down the circuits and the voltage regulator while keeping the volatile memory powered. Important data may be lost when there is a power outage during which a memory state is not preserved. As the circuits consume significant battery power, the useful lifetime of the battery may be shortened. In addition, the battery may not be able to provide enough power for a transmission operation. Adding a voltage level shifting circuitry may be costly in terms of energy usage and size due to power and size inefficiency thereof.

SUMMARY

A method, a circuit and/or a system of power management in an electronic system through reducing energy usage of a battery and/or controlling output power of an amplifier thereof are disclosed.

In one aspect, a method includes automatically charging a capacitor coupled to a battery configured to power a memory through a charge switch that is closed whenever a voltage of the battery exceeds a recovery trip voltage or exceeds a shutdown trip voltage but is less than the recovery trip voltage and opened whenever the voltage of the battery drops below the shutdown trip voltage such that a minimum voltage of the shutdown trip voltage is maintained on the battery, thereby enabling the memory to retain information therein. The method also includes rendering a stored energy of the capacitor available to all circuitry coupled to the battery following the charging thereof through coupling the capacitor in parallel with the battery based on closure of a discharge switch following the charging of the capacitor.

In another aspect, a system includes a battery configured to power a memory, a capacitor coupled to the battery through a charge switch and a discharge switch, and a switch logic. The switch logic is configured to enable automatic charging of the capacitor through closing the charge switch whenever a voltage of the battery exceeds a recovery trip voltage or exceeds a shutdown trip voltage but is less than the recovery trip voltage and opening the charge switch whenever the voltage of the battery drops below the shutdown trip voltage such that a minimum voltage of the shutdown trip voltage is maintained on the battery, thereby enabling the memory to retain information therein. The switch logic is also configured to render a stored energy of the capacitor available to all circuitry coupled to the battery following the charging thereof through coupling the capacitor in parallel with the battery based on closure of the discharge switch following the charging of the capacitor.

The methods and systems disclosed herein may be implemented in any means for achieving various aspects, and may be executed in a form of a machine-readable medium embodying a set of instructions that, when executed by a machine, cause the machine to perform any of the operations disclosed herein.

Other features will be apparent from the accompanying drawings and from the detailed description that follows.

DESCRIPTION OF THE DIAGRAMS

Example embodiments are illustrated by way of example and not limitation in the figures of the accompanying drawings, in which like references indicate similar elements and in which:

FIG. 9 is a process flow diagram detailing the operations involved in minimizing current drawn from the battery of FIG. 1 while preserving a state of a memory using the memory power switch of FIG. 1, according to one or more embodiments.

Other features of the present embodiments will be apparent from the accompanying drawings and from the disclosure of the various embodiments.

DETAILED DESCRIPTION

A method, a circuit and/or a system of power management in an electronic system through reducing energy usage of a battery and/or optimizing output power of an amplifier thereof are disclosed. In the following description, for the purposes of explanation, numerous specific details are set forth in order to provide a thorough understanding of the various embodiments. It will be evident, however to one skilled in the art that the various embodiments may be practiced without these specific details.

Figure 1:
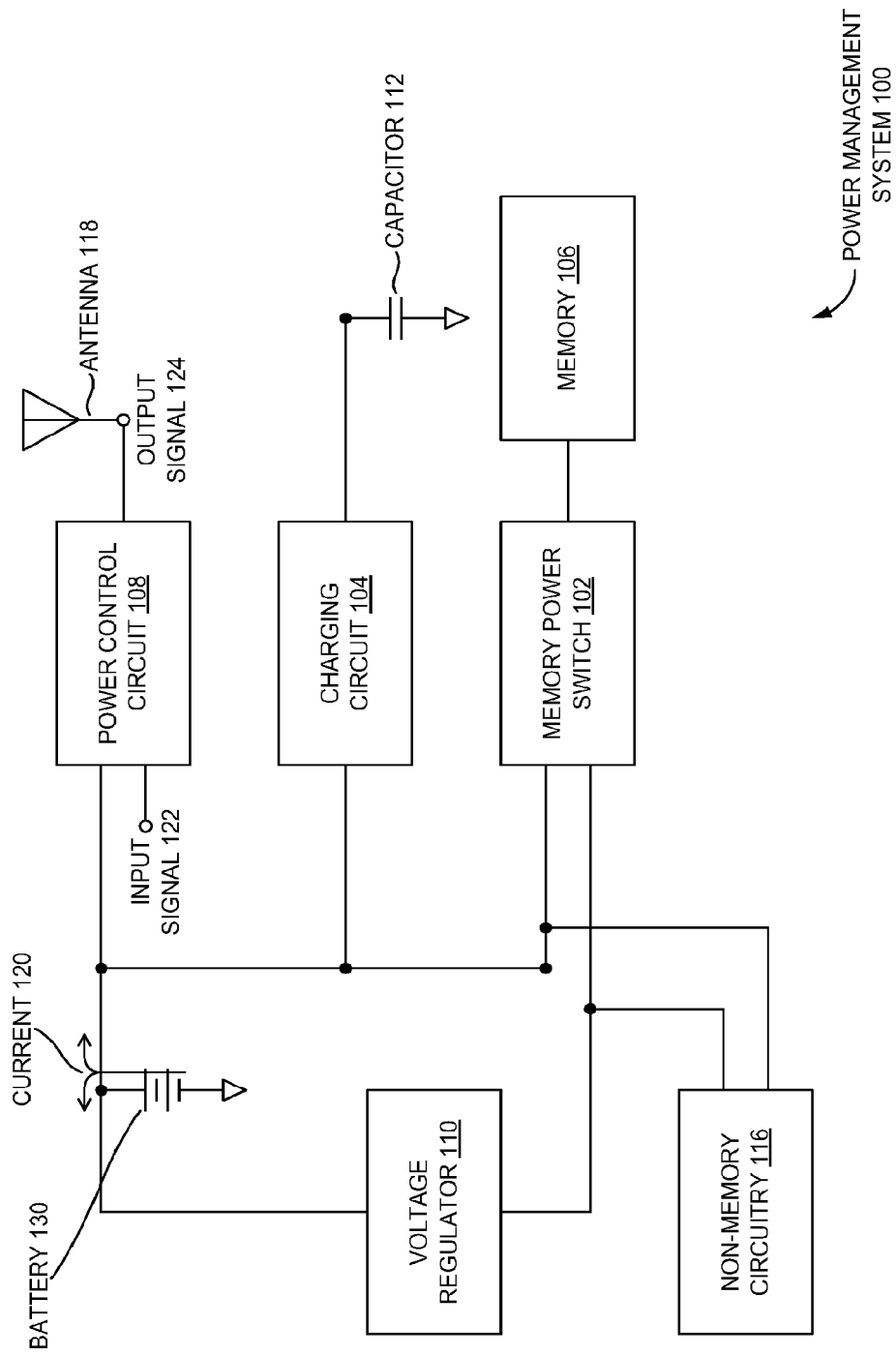
FIG. 1 is a schematic view of a power management system, according to one or more embodiments.

FIG. 1 shows a power management system 100, according to one or more embodiments. In one or more embodiments, power management system 100 may include various electrical circuits (to be discussed) configured to be powered by a battery 130. In one or more embodiments, power management system 100 may provide for a reduction in the energy usage of battery 130 through various optimization techniques to be discussed herein. In one or more embodiments, power management system 100 may include memory 106 (e.g., volatile memory such as Random Access Memory (RAM), registers) and non-memory circuitry 116. In one or more embodiments, other components of power management system 100 may include voltage regulator 110, a transmitter such as antenna 118 and a capacitor 112.

In one or more embodiments, voltage regulator 110 may be utilized to moderate and/or reduce the voltage of battery 130 for at least some of memory 106/non-memory circuitry 116. In one or more embodiments, antenna 118 may be utilized to transmit information wirelessly during short periods thereof. In one or more embodiments, during the aforementioned short periods of information transmission, capacitor 112 may be temporarily utilized to store energy for use therefor. In one or more embodiments, memory 106 may be utilized to obviously store the information.

In order to reduce energy usage of battery 130, three circuits are discussed and described herein, viz. a power control circuit 108, a charging circuit 104 and a memory power switch 102. In one or more embodiments, power control circuit 108 may reduce energy usage of battery 130 by optimizing transmission power. In one or more embodiments, charging circuit 104 may reduce energy usage of battery 130 by optimizing a time to charge capacitor 112 depending on a condition of battery 130. In one or more embodiments, memory power switch 102 may reduce energy usage of battery 130 by eliminating a need for voltage level shifting circuitry.

As shown in FIG. 1, battery 130 may provide power to power control circuit 108, charging circuit 104 and memory power switch 102. In one or more embodiments, voltage regulator 110 and memory power switch 102 may also be coupled to non-memory circuitry 116. In one or more embodiments, non-memory circuitry 116 may be a set of circuits (e.g., a control circuit, a monitor circuit, a transducer circuit) not utilized for storage purposes.

In one or more embodiments, charging circuit 104 may be used to optimize charging time for capacitor 112 driven from battery 130 while preserving a state of memory 106. In one or more embodiments, current 120 from battery 130 may be automatically reduced to ensure that battery 130 maintains a minimum voltage thereof through the operation of charging circuit 104. In one or more embodiments, voltage regulator 110 may be configured to provide power to memory 106 through memory power switch 102 while non-memory circuitry 116 is actively communicating with memory 106. In one or more embodiments, battery 130 may provide power to memory 106 through memory power switch 102 while non-memory circuitry 116 is powered down. In one or more embodiments, capacitor 112 and/or battery 130 may provide power to the power control circuit 108 for the transmission operation of antenna 118. In one or more embodiments, capacitor 112 may be charged from battery 130 while a minimum voltage on the battery 130 is maintained, and a state of memory 106 is preserved.

Figure 2A:
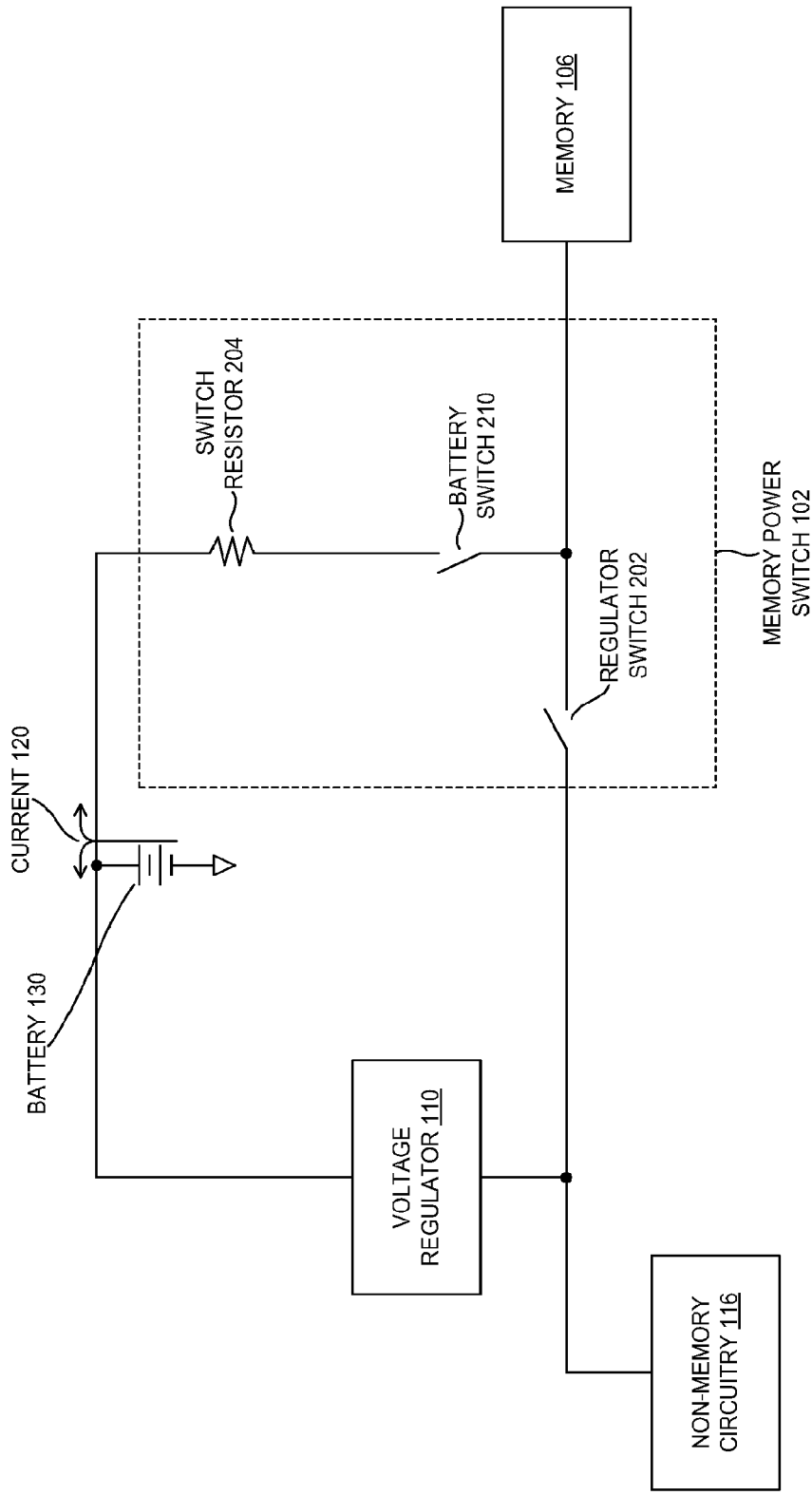
FIG. 2A is a schematic view of a memory power switch of FIG. 1, according to one or more embodiments.

FIG. 2A is a schematic view of the memory power switch 102 of FIG. 1, according to one or more embodiments. In one or more embodiments, memory power switch 102 may include a switch resistor 204, a regulator switch 202 and a battery switch 210. In one or more embodiments, non-memory circuitry 116 may be powered by voltage regulator 110. In one or more embodiments, battery switch 210 may be coupled between battery 130 and memory 106. In one or more embodiments, switch resistor 204 may be coupled between battery 130 and battery switch 210 to provide an appropriate voltage to memory 106 when battery switch 210 is closed. In one or more embodiments, regulator switch 202 may be coupled between voltage regulator 110 and memory 106.

In one or more embodiments, it may be desirable to shut down all of non-memory circuitry 116 and voltage regulator 110 while maintaining DC power to memory 106. In one or more embodiments, a preferred solution may involve utilizing memory power switch 102 to switch the power supply of memory 106 from battery 130 when non-memory circuitry 116 is inactive to the regulated voltage (from voltage regulator 110) when non-memory circuitry 116 is active without interrupting power to memory 106, which otherwise may cause memory 106 to lose information stored therein.

Figure 2B:
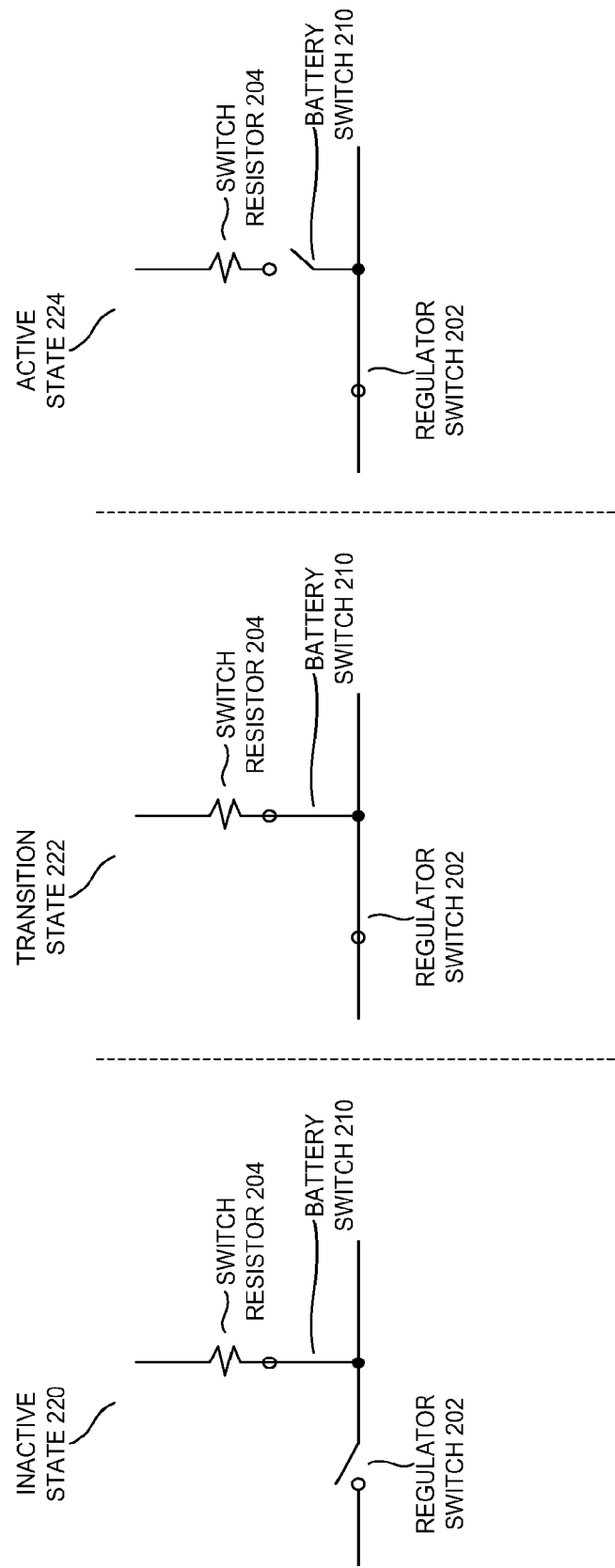
FIG. 2B is an illustrative view of a switching sequence of the memory power switch of FIG. 2A, according to one or more embodiments.

FIG. 2B illustrates a switching sequence of memory power switch 102, according to one or more embodiments. In one or more embodiments, as seen in FIG. 2B, battery switch 210 may be closed in an inactive state 220 of non-memory circuitry 116. In one or more embodiments, in the aforementioned inactive state 220, memory 106 may be powered from battery 130. Also, in one or more embodiments, regulator switch 202 may be open during inactive state 220 and battery switch 210 may be closed during inactive state 220. In one or more embodiments, as seen in FIG. 2B, both battery switch 210 and regulator switch 202 may be closed in a transition state 222 of memory 106 about to communicate with non-memory circuitry 116 being "awakened" into activity. In one or more embodiments, the aforementioned transition state 222 may involve voltage regulator 110 being turned ON and battery 130 being coupled to the regulated voltage through switch resistor 204 while still powering memory 106.

In one or more embodiments, thus, the power supply voltage applied to memory 106 during transition state 222 may be a combination of voltage from battery 130 and voltage from voltage regulator 110. In one or more embodiments, as seen in FIG. 2B, active state 224 may involve all circuitry (memory 106 and non-memory circuitry 116) being powered from the regulated voltage. Here, in one or more embodiments, battery switch 210 may be open and regulator switch 202 may be closed.

In one or more embodiments, there may be another transition state during shutdown where battery 130 is once again coupled to voltage regulator 110 through switch resistor 204. However, it is obvious to see that the diagram for the state would be analogous to transition state 222. In one or more embodiments, the appropriate utilization of memory power switch 102 may allow for more efficiency in power and circuit size in contrast to solutions involving keeping memory 106 always coupled to battery 130, which requires voltage shifting circuitry to allow for memory 106 to communicate with non-memory circuitry 116 powered from voltage regulator 110.

Figure 3A:
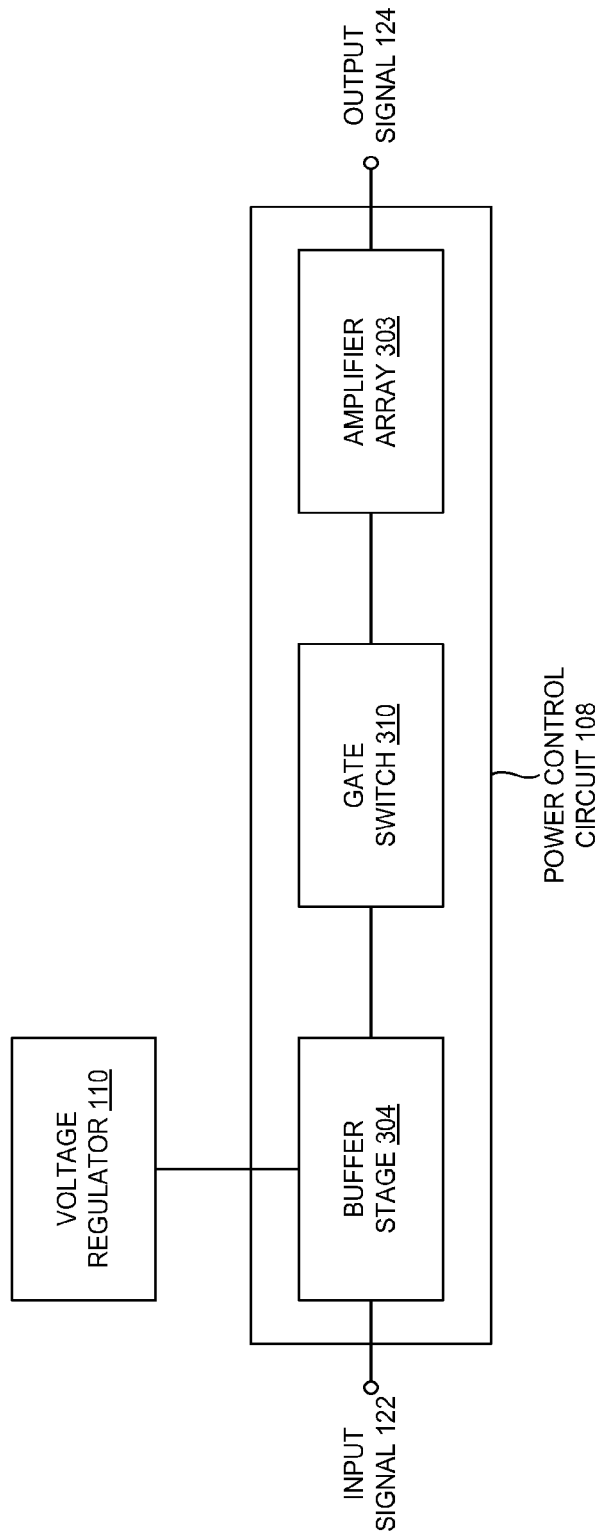
FIG. 3A is a schematic view of a power control circuit of FIG. 1, according to one or more embodiments.

FIG. 3A shows power control circuit 108 of FIG. 1, according to one or more embodiments. In one or more embodiments, power control circuit 108 may include an amplifier array 303 coupled to a buffer stage 304 at the input through a set of gate switches 310. In one or more embodiments, power control circuit 108 may be utilized to adjust an output signal 124 in power management system 100 including a power amplifier.

In one or more embodiments, buffer stage 304 may take the form of any circuit capable of driving amplifier array 303. In one or more embodiments, buffer stage 304 may be coupled to voltage regulator 110. In one or more embodiments, buffer stage 304 receives input signal 122 that is to be transmitted to amplifier array 303 through gate switch 310. In one or more embodiments, the set of gate switches 310 may be used to turn on or turn off a set of amplifier stages 302 (shown in FIG. 3B) of amplifier array 303 in order to adjust output signal 124.

Figure 3B:
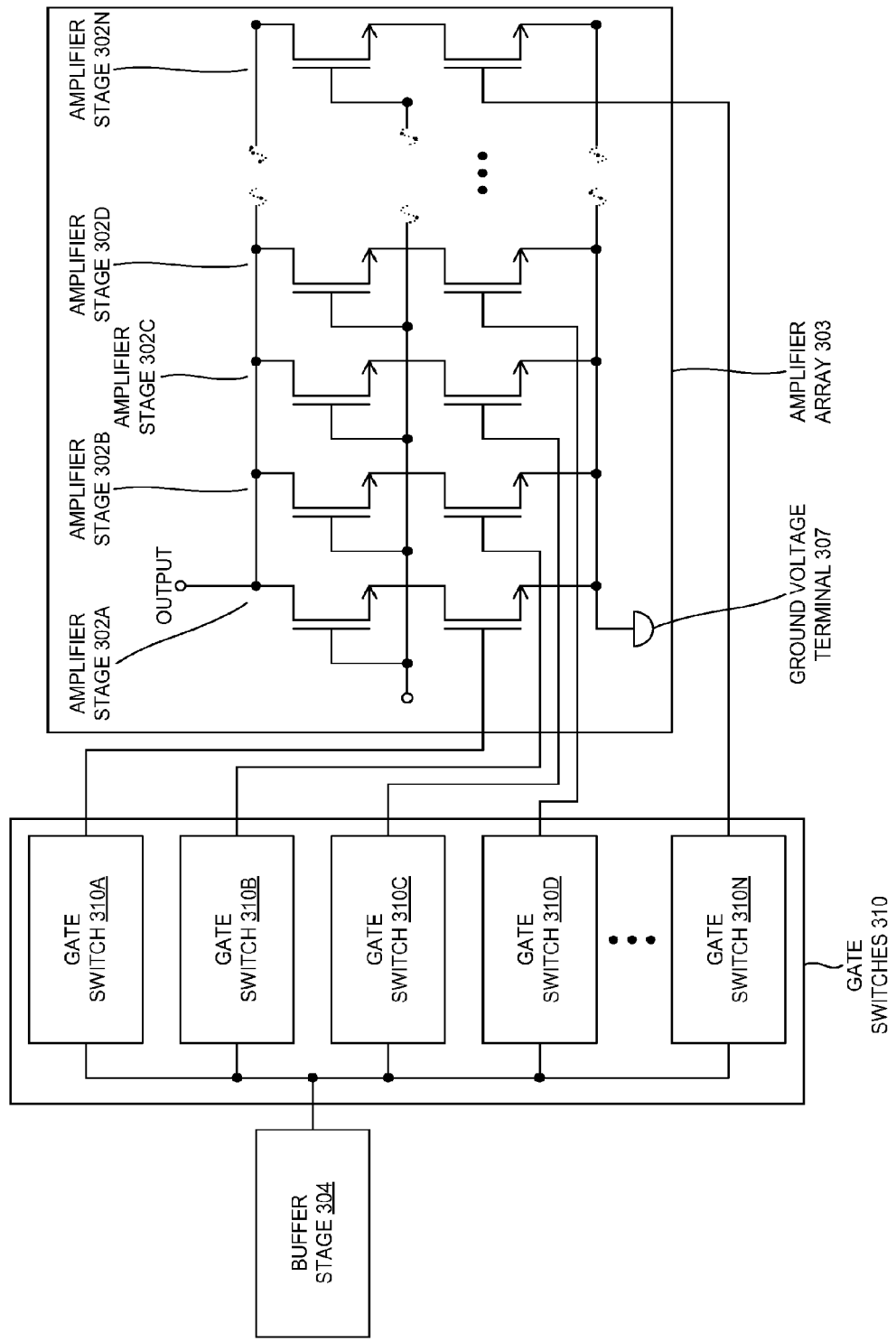
FIG. 3B is an expanded schematic view of the power control circuit of FIG. 3A, according to one or more embodiments.

In accordance with FIG. 3A and FIG. 3B, higher output power (e.g., of output signal 124) may be achieved by turning on more parallel paths (or, amplifier stages 302A-N) of amplifier array 303 through appropriately switching transmission gate switches 310A-N of gate switch 310. In one or more embodiments, lower output power may be achieved by correspondingly decreasing the number of parallel paths turned on. Thus, minimum power may be achieved by turning on a single amplifier stage 302, and maximum power may be achieved by turning on all amplifier stages 302A-N. In one or more embodiments, the number of power control steps may obviously be equal to the number of parallel paths of amplifier array 303.

Thus, in one or more embodiments, a current drawn (not shown) by amplifier array 303 from battery 130 into a drain output thereof may be optimized by appropriately coupling amplifier stages 302A-N to a corresponding gate switch 310A-N to individually switch each of the amplifier stages 302A-N on and off.

Figure 3C:
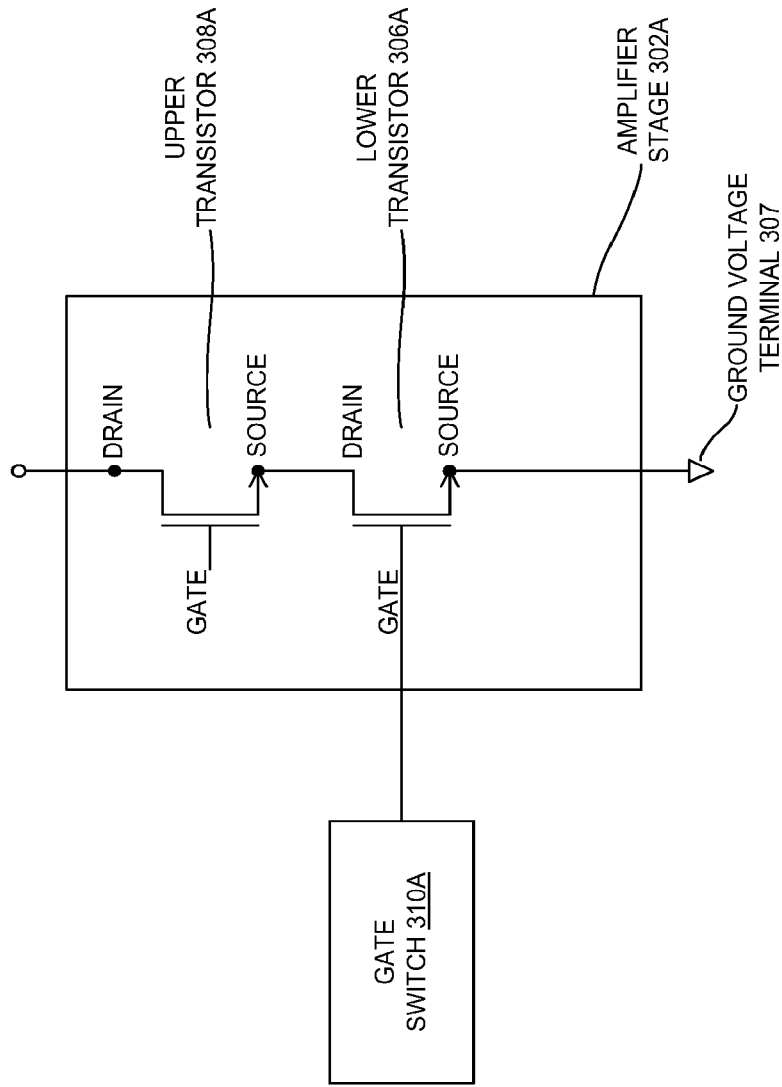
FIG. 3C is an expanded schematic view of an amplifier stage of FIG. 3B, according to one or more embodiments.

As shown in FIG. 3B, amplifier array 303 may include N amplifier stages (e.g., amplifier stages 302A-N), and the set of gate switches 310 may include N gate switches (e.g. gate switches 310A-N). In an example embodiment, amplifier array 302 may be a parallel NMOS common source amplifier bank. Here, lower transistor 306A (refer to FIG. 3C) may be coupled to gate switch 310A through the gate terminal thereof. The source (or, drain) terminal of lower transistor 306A may be coupled to ground voltage terminal 307 and the drain (or, source) terminal of lower transistor 306A may be coupled to the corresponding source (or, drain) terminal of upper transistor 308A (refer to FIG. 3C). The output may be taken from the corresponding drain (or, source) terminal of upper transistor 308A. The lower transistor 306A may provide for amplification, and the upper transistor 308A may be a cascode device providing isolation for each path for N bit control.

Figure 3D:
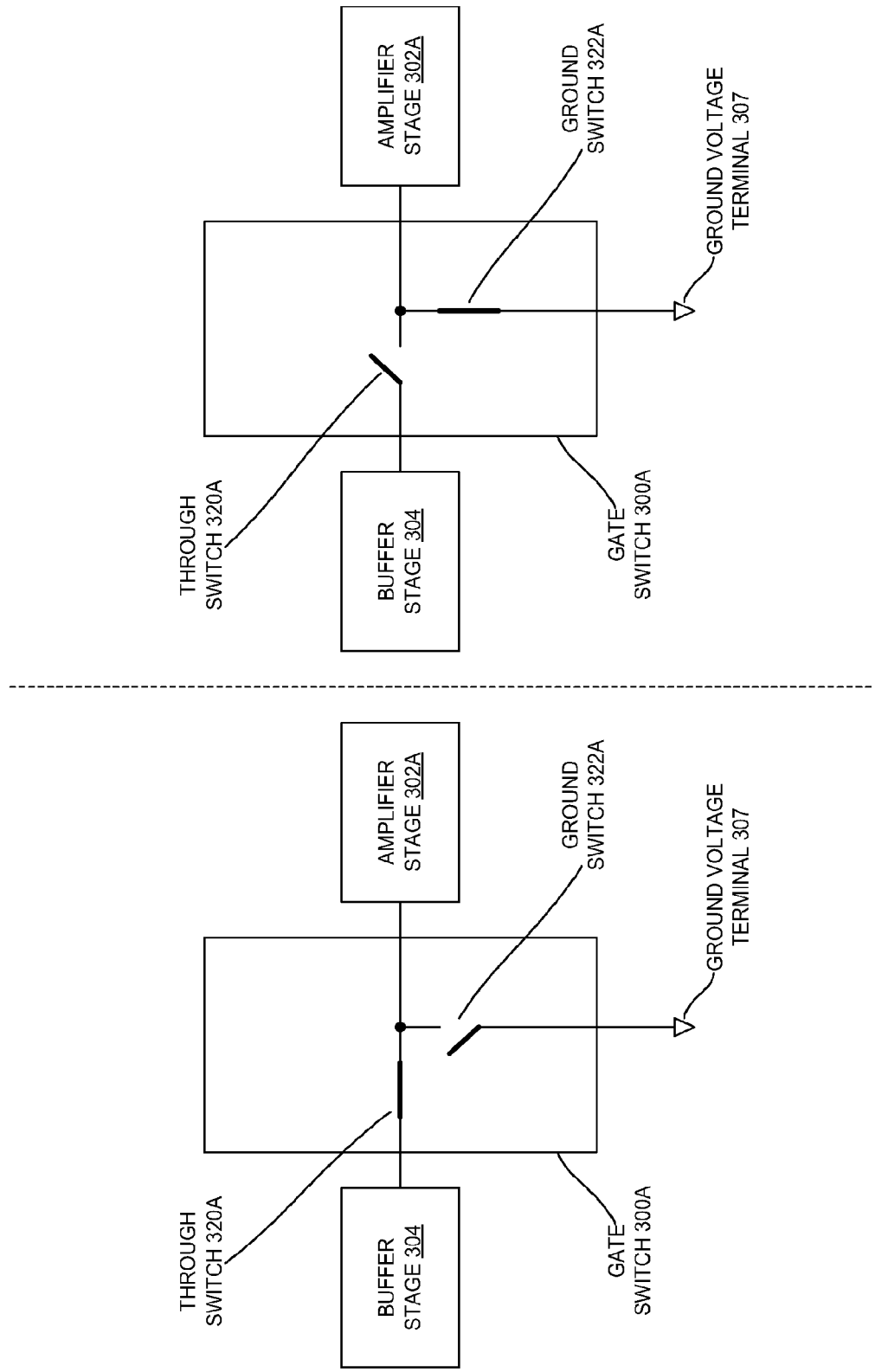
FIG. 3D is an expanded schematic view of a gate switch of FIG. 3B, according to one or more embodiments.

Thus, each common source lower transistor 306A may be coupled to a corresponding switch pair in gate switch 310. In one or more embodiments, power may be controlled through applying a signal from buffer stage 304 to one or more or all of the parallel common source amplifiers of amplifier array 303 through appropriately switching gate switches 310A-N. In an example embodiment, as shown in FIG. 3D, the gate switch (e.g. the gate switch 310A) may include a through switch 320A coupled between buffer stage 304 and amplifier stage 302A. Gate switch 310A may also include a ground switch 322A located between amplifier stage 302A and ground voltage terminal 307.

When an amplifier stage 302A is off, through switch 320A may be open and ground switch 322A may be closed. This may ensure that amplifier stage 302A is off. When a signal is applied to amplifier stage 302A, gate switch 310A corresponding thereto may couple the output of buffer stage 304 to the gate terminal of lower transistor 306A, thereby implying that through switch 322A is closed and ground switch 322A is open. Thus, a corresponding amplifier stage 302A (or, path) is on.

It is obvious that variations in the configurations of elements such as buffer stage 304 are within the scope of the exemplary embodiments discussed herein, and that exemplary embodiments are shown in particular configurations merely to illustrate concepts associated therewith. In one or more embodiments, power control circuit 108 may mitigate and/or solve problems associated with traditional solutions such as varying bias current applied to an amplifier to control output power thereof and varying the input signal to the amplifier.

Figure 4:
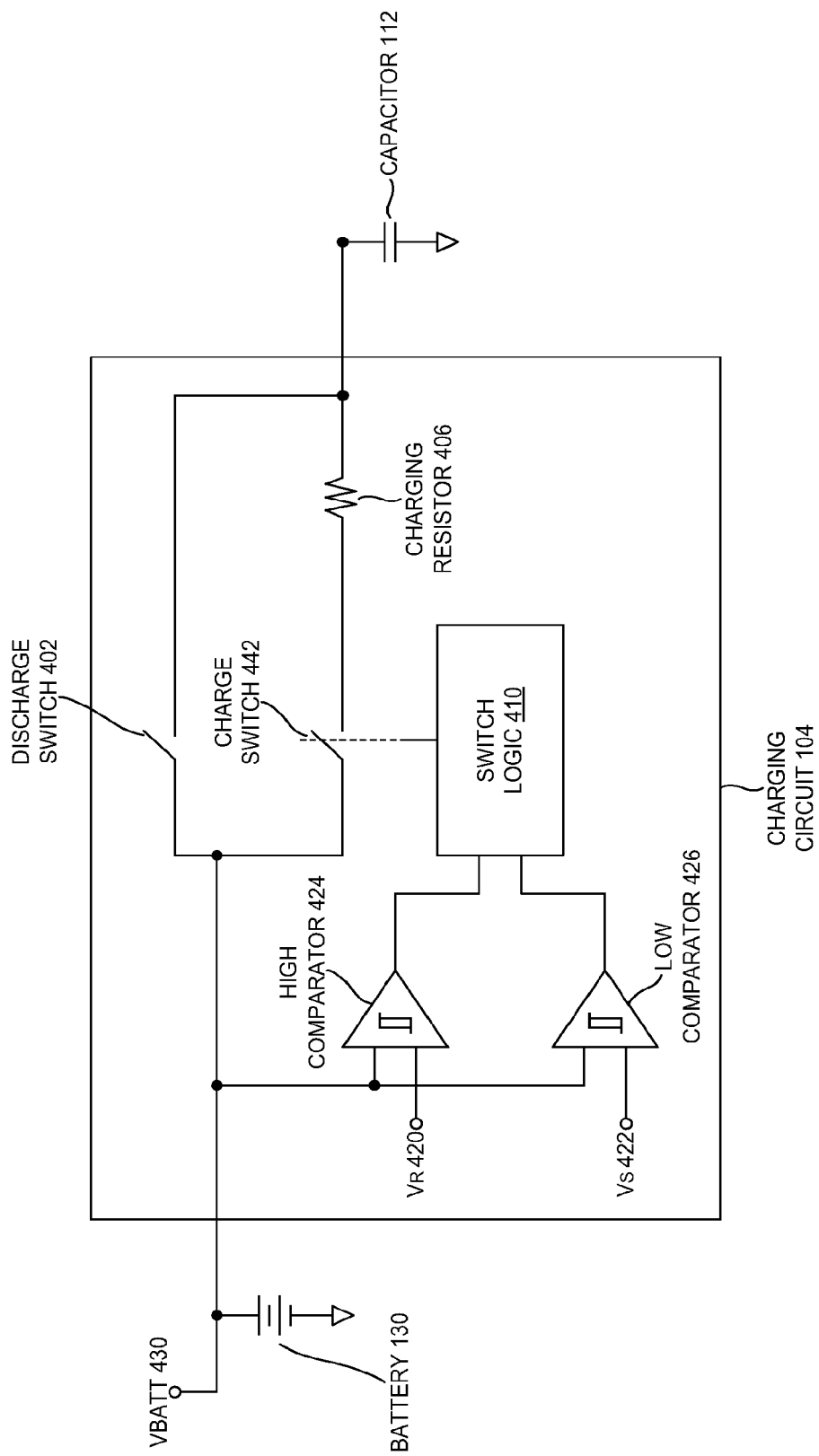
FIG. 4 is a schematic view of a charging circuit of FIG. 1, according to one or more embodiments.

FIG. 4 shows charging circuit 104 of FIG. 1 coupled between battery 130 and capacitor 112, according to one or more embodiments. In one or more embodiments, charging circuit 104 may include a charge switch 442, a discharge switch 402, a charging resistor 406, a switch logic 410, a high comparator 424, and a low comparator 426. In one or more embodiments, charge switch 442 may be coupled between battery 130 and capacitor 112 (e.g., through charging resistor 406). In one or more embodiments, discharge switch 402 may merely be coupled between battery 130 and capacitor 112. Thus, in one or more embodiments, charge switch 442 and discharge switch 402 are coupled in parallel to each other.

In an example system (e.g., power management system 100), the age and the temperature of battery 130 may be unknown. In one or more embodiments, a new and warm battery 130 may provide enough power for a short high-powered radio transmission from the system. However, in one or more embodiments, when battery 130 is old and cold, battery 130 may be unable to provide enough power for the aforementioned short radio transmission operation, which occurs intermittently. Thus, in one or more embodiments, a large capacitor 112 may be required for battery 130 to provide power during the short transmission period (also discussed above). In one or more embodiments, through the addition of energy to capacitor 112 over a long time period, the energy stored therein maybe available to help battery 130 during the short transmission period.

In one or more embodiments, capacitor 112 may be charged from battery 130 through charging resistor 406 by closing charge switch 442. A typical issue during the initial stage of charging with an old/cold battery is that the current flowing into capacitor 112 from battery 130 may cause the voltage of battery 130 to drop below a threshold minimum required to maintain states of memory 106. Exemplary embodiments discussed with reference to FIG. 4 eliminate the aforementioned issue through providing an automatic circuit for charging capacitor 112 while maintaining a minimum voltage on battery 130. In one or more embodiments, capacitor 112 may be charged while maintaining current drained from battery 130 at a small enough level that ensures that a minimum voltage on battery 130 is maintained to retain information in memory 106.

In one or more embodiments, when capacitor 112 is fully charged and the system prepared for a transmission, charge switch 442 may be automatically opened and discharge switch 402 may be automatically closed. In one or more embodiments, with discharge switch 402 closed, capacitor 112 may directly be coupled in parallel to battery 130, and the stored energy in capacitor 112 may be available to all circuitry connected to battery 130. In one or more embodiments, whenever a voltage 430 of battery 130 (Vbatt 430) is higher than a recovery trip voltage Vr 420, charge switch 442 may be closed through switch logic 410 (e.g., a logic circuit) of charging circuit 104. In one or more embodiments, even when Vr 420 is higher than Vbatt 430, charge switch 442 may remain closed if Vbatt 430 is higher than a shutdown trip voltage Vs 422. In one or more embodiments, once Vbatt 430 drops below Vs 422, charge switch 442 may be open through switch logic 410. Thus, in one or more embodiments, Vbatt 430 and Vr 420 may be the two inputs for the high comparator 424 and Vbatt 430 and Vs 422 may be the two inputs for the low comparator 426. In one or more embodiments, the output of high comparator 424 and the output of low comparator 426 may be the inputs for switching logic 410. Therefore, in one or more embodiments, the outputs of high comparator 424 and low comparator 426 determine the open/close operations performed through switching logic 410.

Figure 5:
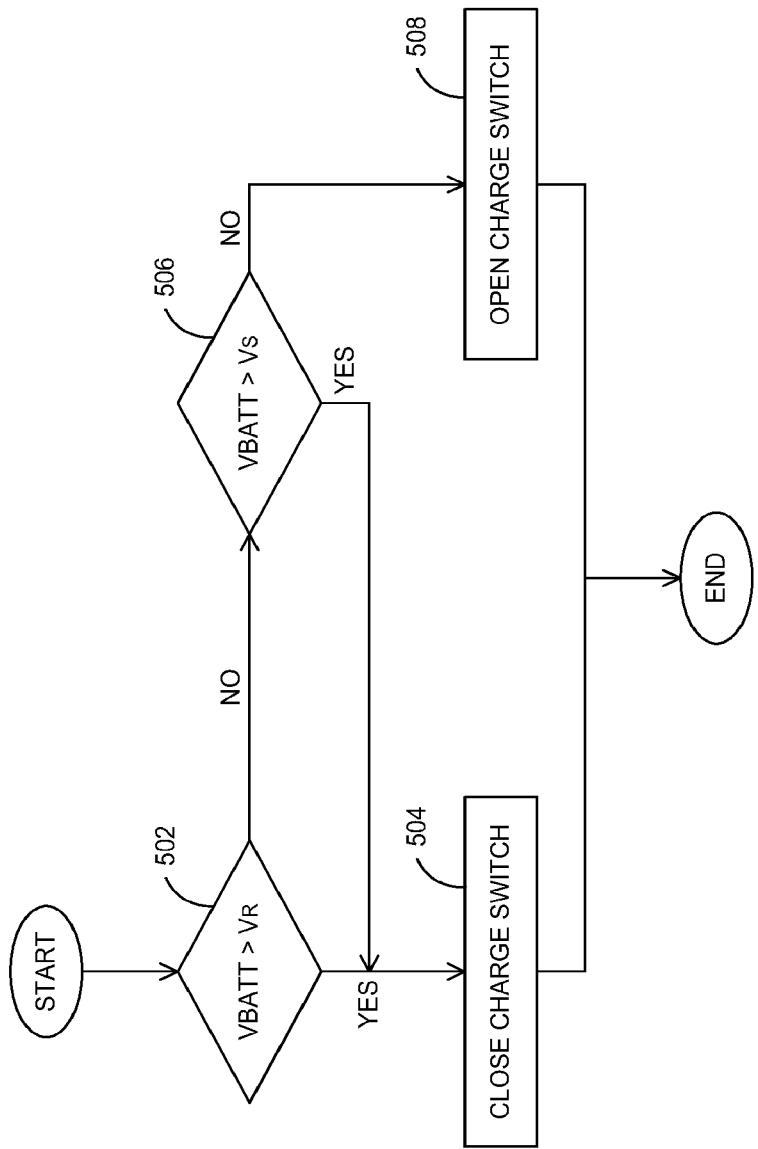
FIG. 5 is a flowchart detailing the operations involved in opening/closing of a charge switch of the charging circuit of FIG. 4, according to one or more embodiments.

In one or more embodiments, Vr 420 and Vs 422 may obviously be reference voltages for comparison of Vbatt 430, based on which decisions are made by switching logic 410. FIG. 5 is a flowchart detailing the operations involved in the opening/closing of charge switch 442, according to one or more embodiments. In one or more embodiments, operation 502 may involve checking through high comparator 424 as to whether Vbatt 430>Vr 420. In one or more embodiments, if yes, operation 504 may involve closing charge switch 442 through switching logic 410. In one or more embodiments, if no, operation 506 may involve checking through low comparator 426 as to whether Vbatt 430>Vs 422. In one or more embodiments, if yes, charge switch 442 may be closed through switching logic 410. In one or more embodiments, if no, charge switch 442 may be opened in operation 508 (or, may remain open) through switching logic 410.

Figure 6:
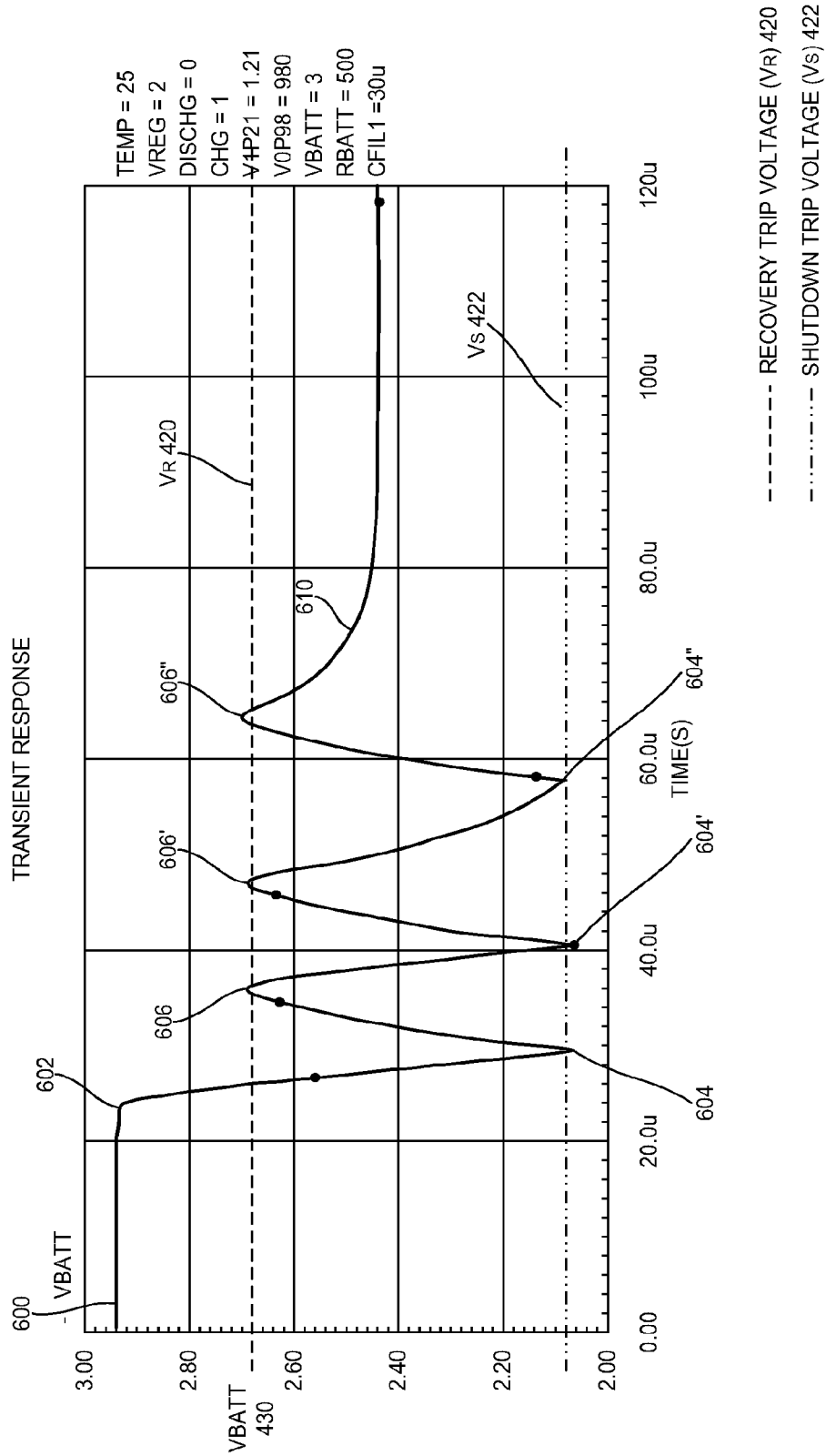
FIG. 6 is an example plot of variation in voltage of a battery of FIG. 4, according to one or more embodiments.

FIG. 6 shows an example variation in Vbatt 430 during the automatic charging discussed with regard to FIG. 4 and FIG. 5. For example, Vbatt 430 initially may be approximately 3 volts. Vr 420 and Vs 422 may be 2.7 Volts and 2.1 Volts, respectively. Initially, the charging of capacitor 112 may result in a drop in Vbatt 430 because capacitor 112 draws current therefrom. At the 2.1 Volt (Vs 422) level, charge switch 442 may be automatically opened to interrupt charging of capacitor 112 and to keep Vbatt 430 above 2.0 Volts. After Vbatt 430 has recovered above 2.7 Volts (Vr 420), charge switch 442 may be closed again for charging of capacitor 112. Once again, Vbatt 430 may drop because of the current drawn by capacitor 112 therefrom. Thus, the automatic charging operation may cycle until the power required for continuing the charging of capacitor 112 is small enough for battery 130 to provide while maintaining Vbatt 430 above 2.1 Volts (Vs 422). Points 600, 602, 604, 606, 604', 606', 604'', 606'' and 610 are amplitude levels of Vbatt 430, and are self-explanatory.

In one or more embodiments, the abovementioned cycling sequence may represent optimum charging time for a given condition of battery 130, a size of capacitor 112 and/or a size of charging resistor 406, while maintaining a minimum voltage of battery 130. In one or more embodiments, through the customization of the charging methodology to the age and temperature of battery 130, charging circuit 104 may reduce overall power dissipation by minimizing the charging time of capacitor 112.

In one or more embodiments, referring to FIG. 1, the benefits provided through individual circuits (power control circuit 108, charging circuit 104, memory power switch 102) discussed herein may be collectively realized in power management system 100. Alternately, the benefits may be individually realized through the aforementioned individual circuits.

In one or more embodiments, exemplary embodiments provide for a system architecture for improved battery current optimization in a specific application to reduce/optimize power consumption in wireless transceivers and remote sensing electronics. Example use case circuits also may include power amplifiers.

Figure 7:
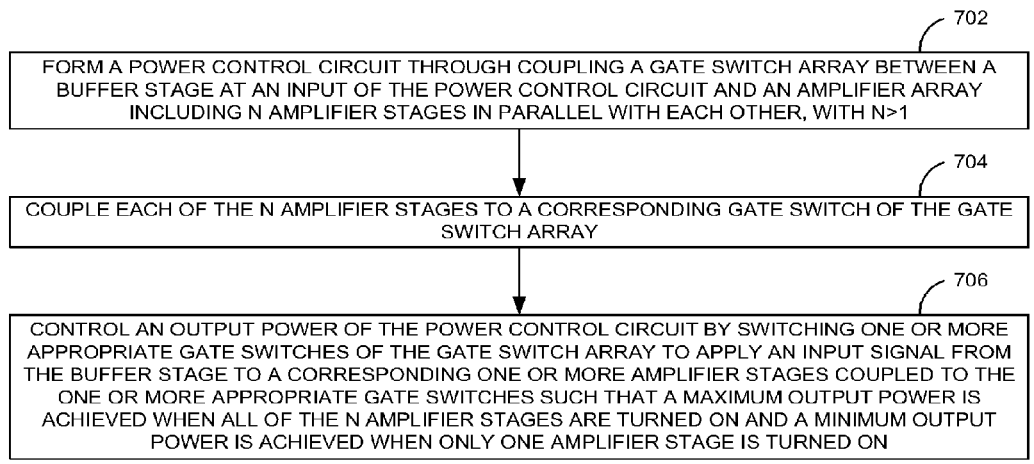
FIG. 7 is a process flow diagram detailing the operations involved in a method of controlling output power in the power control circuit of FIG. 1, according to one or more embodiments.

FIG. 7 shows a process flow diagram detailing the operations involved in a method of controlling output power in power control circuit 108, according to one or more embodiments. In one or more embodiments, operation 702 may involve forming power control circuit 108 through coupling gate switch array (e.g., gate switches 310A-N) between buffer stage 304 at an input of power control circuit 108 and an amplifier array 303 including N amplifier stages in parallel to each other, with N>1. In one or more embodiments, operation 704 may involve coupling each of the N amplifier stages 302A-N to a corresponding gate switch 310A-N of the gate switch array.

In one or more embodiments, operation 706 may then involve controlling an output power of power control circuit 108 by switching one or more appropriate gate switches 310A-N of the gate switch array to apply an input signal from buffer stage 304 to a corresponding one or more amplifier stages 302A-N coupled to the one or more appropriate gate switches 310A-N such that a maximum output power is achieved when all of the N amplifier stages 302A-N are turned on and a minimum output power is achieved when only one amplifier stage 302A-N is turned on.

Figure 8:
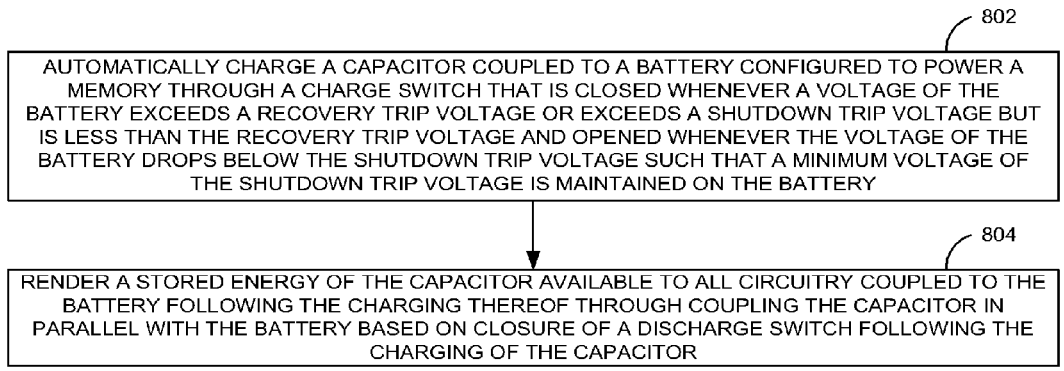
FIG. 8 is a process flow diagram detailing the operations involved in utilizing the charging circuit of FIG. 1 to charge a capacitor while maintaining a minimum battery voltage, according to one or more embodiments.

FIG. 8 is a process flow diagram detailing the operations involved in utilizing charging circuit 104 to charge capacitor 112 while maintaining a minimum battery 130 voltage, according to one or more embodiments. In one or more embodiments, operation 802 may involve automatically charging capacitor 112 coupled to battery 130 configured to power memory 106 through charge switch 442 that is closed whenever a voltage of battery 130 exceeds a recovery trip voltage Vr 420 and exceeds a shutdown trip voltage Vs 422 but is less than the recovery trip voltage Vr 420 and opened whenever the voltage of battery 130 drops below the shutdown trip voltage Vs 422 such that a minimum voltage of the shutdown trip voltage Vs 422 is maintained on battery 130, thereby enabling memory 106 to retain information therein. In one or more embodiments, operation 804 may then involve rendering a stored energy of capacitor 112 available to all circuitry coupled to battery 130 following the charging thereof through coupling capacitor 112 in parallel with battery 130 based on closure of discharge switch 402 following the charging of capacitor 112.

FIG. 9 is a process flow diagram detailing the operations involved in minimizing current drawn from battery 130 while preserving a state of memory 106 using memory power switch 102, according to one or more embodiments. In one or more embodiments, operation 902 may involve configuring battery 130 and/or voltage regulator 110 configured to regulate an output voltage of battery 130 to supply power to memory 106 of an electronic circuit also comprising non-memory circuitry 116 based on switching the supply of power between battery 130 and voltage regulator 110 such that: memory 106 may be powered from battery 130 when non-memory circuitry 116 is inactive, memory 106 may be powered from a combination of voltage from battery 130 and voltage regulator 110 when memory 106 is about to communicate with non-memory circuitry 116 during a transition of non-memory circuitry 116 into an active state thereof, and memory 106 and non-memory circuitry 116 are powered from voltage regulator 110 during the active state of non-memory circuitry 116.

Although the present embodiments has been described with reference to specific example embodiments, it will be evident that various modifications and changes may be made to these embodiments without departing from the broader spirit and scope of the various embodiments. For example, the various devices, modules, analyzers, generators, etc. described herein may be enabled and operated using hardware circuitry (e.g., CMOS based logic circuitry), firmware, software and/or any combination of hardware, firmware, and/or software (e.g., embodied in a machine readable medium).

In addition, it will be appreciated that the various operations, processes, and methods disclosed herein may be embodied in a machine-readable medium and/or a machine accessible medium compatible with a data processing system (e.g., a computer system), and may be performed in any order (e.g., including using means for achieving the various operations). Accordingly, the specification and drawings are to be regarded in an illustrative rather than a restrictive sense.

What is claimed is:

1. A method comprising:
    automatically charging a capacitor coupled to a battery configured to power a memory through a charge switch that is closed whenever a voltage of the battery one of: exceeds a recovery trip voltage and exceeds a shutdown trip voltage but is less than the recovery trip voltage and opened whenever the voltage of the battery drops below the shutdown trip voltage such that a minimum voltage of the shutdown trip voltage is maintained on the battery, thereby enabling the memory to retain information therein; and
    rendering a stored energy of the capacitor available to all circuitry coupled to the battery following the charging thereof through coupling the capacitor in parallel with the battery based on closure of a discharge switch following the charging of the capacitor.

2. The method of claim 1, comprising opening and closing the charge switch and the discharge switch through a switch logic configured to have outputs of a high comparator and a low comparator as inputs thereto, the high comparator being configured to perform a comparison of the voltage of the battery and the recovery trip voltage, and the low comparator being configured to perform a comparison of the voltage of the battery and the shutdown trip voltage.

3. The method of claim 1, further comprising charging the capacitor through a charging resistor coupled in series between the charge switch and the capacitor.

4. A system comprising:
    a battery configured to power a memory;
    a capacitor coupled to the battery through a charge switch and a discharge switch; and
    a switch logic:
        to enable automatic charging of the capacitor through closing the charge switch whenever a voltage of the battery one of: exceeds a recovery trip voltage and exceeds a shutdown trip voltage but is less than the recovery trip voltage and opening the charge switch whenever the voltage of the battery drops below the shutdown trip voltage such that a minimum voltage of the shutdown trip voltage is maintained on the battery, thereby enabling the memory to retain information therein, and
        to render a stored energy of the capacitor available to all circuitry coupled to the battery following the charging thereof through coupling the capacitor in parallel with the battery based on closure of the discharge switch following the charging of the capacitor.

5. The system of claim 4, further comprising: a high comparator and a low comparator configured to have outputs thereof as inputs to the switch logic, the high comparator being configured to perform a comparison of the voltage of the battery and the recovery trip voltage, and the low comparator being configured to perform a comparison of the voltage of the battery and the shutdown trip voltage.

6. The system of claim 4, further comprising a charging resistor coupled in series between the charge switch and the capacitor to charge the capacitor.

\* \* \* \* \*